(12) United States Patent
Tan et al.

(10) Patent No.: US 10,096,602 B1
(45) Date of Patent: *Oct. 9, 2018

(54) MTP MEMORY FOR SOI PROCESS

(71) Applicant: GLOBALFOUNDRIES Singapore Pte. Ltd., Singapore (SG)

(72) Inventors: Shyue Seng Jason Tan, Singapore (SG); Kiok Boone Elgin Quek, Singapore (SG)

(73) Assignee: GLOBALFOUNDRIES SINGAPORE Pte. Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 15/459,190

(22) Filed: Mar. 15, 2017

(51) Int. Cl.
| | |
|---|---|
| *H01L 27/06* | (2006.01) |
| *H01L 27/105* | (2006.01) |
| *H01L 29/423* | (2006.01) |
| *H01L 29/788* | (2006.01) |
| *H01L 27/12* | (2006.01) |
| *H01L 29/78* | (2006.01) |

(Continued)

(52) U.S. Cl.
CPC .......... *H01L 27/1052* (2013.01); *H01L 21/84* (2013.01); *H01L 27/0629* (2013.01); *H01L 27/1203* (2013.01); *H01L 29/42328* (2013.01); *H01L 29/42356* (2013.01); *H01L 29/66825* (2013.01); *H01L 29/7838* (2013.01); *H01L 29/7883* (2013.01)

(58) Field of Classification Search
CPC ................. H01L 27/1052; H01L 21/84; H01L 29/66825; H01L 29/7838; H01L 27/0629; H01L 29/7883; H01L 29/42356; H01L 29/42328; H01L 27/1203; H01L 27/0811; H01L 28/40; H01L 27/0805; H01L 21/823475; H01L 21/823437; H01L 23/535; H01L 29/94

See application file for complete search history.

(56) References Cited

U.S. PATENT DOCUMENTS 9,691,669 B1 * 6/2017 Saxena ................... H01L 22/12
9,837,439 B1 * 12/2017 Faul ..................... H01L 27/1207
(Continued)

OTHER PUBLICATIONS

Noel, et al., "Multi-VT UTBB FDSOI Device Architecture for Low Power CMOS Circuit," IEEE Trans. Electron Devices, vol. 58, No. 8, pp. 2473-2482, 2011.*

(Continued)

*Primary Examiner* — Bitew Dinke
(74) *Attorney, Agent, or Firm* — Horizon IP Pte Ltd.

(57) ABSTRACT

Embodiments of a multi-time programmable (MTP) structure for non-volatile memory cells are presented. The memory cell includes an ultra-thin silicon-on-insulator (SOI) substrate. A transistor having a floating gate is disposed on the SOI substrate. The transistor comprises first and second source/drain (S/D) regions disposed adjacent to sides of the floating gate. A control capacitor having a control gate is disposed on the SOI substrate. The control gate is directly coupled to the floating gate. A device well is disposed in the base substrate and underlaps the floating gate and the control gate. A capacitor back-gate is embedded within the base substrate and in electrical communication with the control gate. A contact region is disposed within the device well.

20 Claims, 16 Drawing Sheets

(51) Int. Cl.
*H01L 29/66* (2006.01)
*H01L 21/84* (2006.01)

(56) References Cited

U.S. PATENT DOCUMENTS

| | | | | |
|---|---|---|---|---|
| 2005/0270850 A1* | 12/2005 | Wang | ........ | G11C 16/0416 365/185.28 |
| 2007/0241392 A1* | 10/2007 | Lin | ........ | G11C 16/0416 257/316 |
| 2008/0035973 A1* | 2/2008 | Lin | ........ | H01L 27/115 257/298 |
| 2009/0134468 A1* | 5/2009 | Tsuchiya | ........ | H01L 21/84 257/368 |
| 2009/0140323 A1* | 6/2009 | Fazan | ........ | G11C 11/404 257/324 |
| 2012/0126333 A1* | 5/2012 | Thomas | ........ | H01L 21/84 257/369 |
| 2013/0015517 A1* | 1/2013 | Widjaja | ........ | G11C 11/404 257/316 |
| 2013/0065366 A1* | 3/2013 | Thomas | ........ | H01L 21/84 438/154 |
| 2013/0175594 A1* | 7/2013 | Basker | ........ | H01L 21/84 257/301 |
| 2013/0248972 A1* | 9/2013 | Chen | ........ | H01L 27/11517 257/320 |
| 2013/0248973 A1* | 9/2013 | Chen | ........ | H01L 27/11517 257/320 |
| 2014/0077864 A1* | 3/2014 | Bianchi | ........ | G01K 7/01 327/512 |
| 2014/0176228 A1* | 6/2014 | Giraud | ........ | H01L 21/84 327/534 |
| 2014/0183612 A1* | 7/2014 | Chen | ........ | H01L 27/11524 257/315 |
| 2014/0319648 A1* | 10/2014 | Fenouillet-Beranger | | H01L 27/0259 257/526 |
| 2014/0361358 A1* | 12/2014 | Chen | ........ | H01L 27/11524 257/315 |
| 2015/0041900 A1* | 2/2015 | Weber | ........ | H01L 27/092 257/351 |
| 2015/0214238 A1* | 7/2015 | Shum | ........ | H01L 29/7883 257/300 |
| 2015/0214316 A1* | 7/2015 | Guo | ........ | H01L 29/42328 257/300 |
| 2015/0221663 A1* | 8/2015 | Tan | ........ | H01L 29/42324 257/300 |
| 2015/0287722 A1* | 10/2015 | Giraud | ........ | H01L 27/1203 257/348 |
| 2015/0287732 A1* | 10/2015 | Tsao | ........ | G11C 5/06 257/319 |
| 2016/0013205 A1* | 1/2016 | Vinet | ........ | H01L 21/762 257/351 |
| 2016/0013206 A1* | 1/2016 | Vinet | ........ | H01L 21/76237 257/351 |
| 2017/0098474 A1* | 4/2017 | Tran | ........ | G11C 7/065 |
| 2017/0125403 A1* | 5/2017 | Kim | ........ | H01L 29/6609 |
| 2017/0148794 A1* | 5/2017 | Guo | ........ | H01L 27/105 |
| 2017/0288059 A1* | 10/2017 | Athanasiou | ........ | H01L 29/7838 |
| 2017/0358574 A1* | 12/2017 | Sun | ........ | H01L 27/0811 |

OTHER PUBLICATIONS

Jean-Philippe Noel et al., Multi-VT UTBB FDSOI Device Architectures for Low-Power CMOS Circuit, IEEE Transactions on Electron Devices, Aug. 2011, vol. 58, No. 8, IEEE.

* cited by examiner

MTP MEMORY FOR SOI PROCESS

BACKGROUND

Non-volatile multi-time programmable (MTP) memories have been introduced for beneficial use in a number of applications where customization is required for both digital and analog designs. Most of the existing approaches for constructing MTP memories are based on planar bulk silicon technology. However, current design limitations for MTP memories have resulted in diminishing improvements in device performance. For example, continued scaling of MTP memories based on bulk silicon technology may undesirably increase short-channel effects (SCE).

Therefore, there is a need to provide improved MTP memories with improved performance.

SUMMARY

Embodiments generally relate to MTP memories. In one embodiment, a non-volatile MTP memory cell is disclosed. The memory cell includes an ultra-thin silicon-on-insulator (SOI) substrate. The SOI substrate includes a very thin buried oxide (BOX) layer disposed between a base substrate and a very thin body substrate layer. The memory cell includes a transistor having a floating gate disposed on the SOI substrate. The transistor includes first and second source/drain (S/D) regions disposed in the body substrate layer and adjacent to sides of the floating gate. The memory cell includes a control capacitor having a control gate disposed on the SOI substrate. The control gate is directly coupled to the floating gate. A device well is disposed in the base substrate and underlaps the floating gate and control gate. A first portion of the device well defines a capacitor back-gate embedded within the base substrate. The capacitor back-gate is in electrical communication with the control gate. A contact region disposed within the device well.

In another embodiment, a non-volatile MTP memory cell is disclosed. The memory cell includes an ultra-thin silicon-on-insulator (SOI) substrate. The SOI substrate includes a very thin buried oxide (BOX) layer disposed between a base substrate and a very thin body substrate layer. The memory cell includes a transistor having a floating gate disposed on the SOI substrate. The transistor includes first and second source/drain (S/D) regions disposed in the body substrate layer and adjacent to sides of the floating gate. The memory cell includes a control capacitor having a control gate disposed on the SOI substrate. The control gate is directly coupled to the floating gate. A device well is disposed in the base substrate and underlaps the floating gate and control gate. A first portion of the device well defines a capacitor back-gate embedded within the base substrate. First and second doped regions are disposed between the control gate and capacitor back-gate. The capacitor back-gate is in electrical communication with the control gate. A contact region disposed within the device well.

In yet another embodiment, a method for forming a non-volatile MTP memory cell is disclosed. The method includes providing a fully depleted silicon-on-insulator (FDSOI) substrate having an isolation region. The FDSOI substrate includes a buried oxide (BOX) layer disposed between a body substrate layer and a base substrate. The isolation region extends from a top of the body substrate layer to a depth below the BOX layer to define active regions of the memory cell. The memory cell includes an active capacitor region and an active transistor region. A device well is formed in the FDSOI substrate. The device well is disposed in the base substrate and extends to a depth below the isolation region. The device well traverses the active capacitor region and active transistor region. First and second doped regions are formed in the active capacitor region. A transistor gate is formed on the body substrate layer. The transistor gate includes a floating gate. A control gate is formed on the body substrate layer. The control gate is coupled to the floating gate. The floating gate and the control gate comprise the same gate layer. The control gate comprises a capacitor. A trench region is formed in the FDSOI substrate to expose a contact region in the device well.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of various embodiments. In the following description, various embodiments of the present disclosure are described with reference to the following, in which.

DETAILED DESCRIPTION

Embodiments of the present disclosure generally relate to semiconductor devices or integrated circuits (ICs). More particularly, some embodiments relate to memory devices, such as non-volatile memory (NVM) devices. Such memory devices, for example, can be incorporated into standalone memory devices, such as USB or other types of portable storage units, or ICs, such as microcontrollers or system on chips (SoCs). The devices or ICs can be incorporated into or used with, for example, consumer electronic products, such as computers, cell phones, and personal digital assistants (PDAs). Incorporating the devices in other applications may also be useful. For example, other applications may include data encryption, reference trimming, manufacturing identification (ID) and security ID. The embodiments as will be described below may relate to technology nodes below 0.45 µm. The embodiments as will be described below may also be applicable to other suitable technology nodes.

Figure 1:
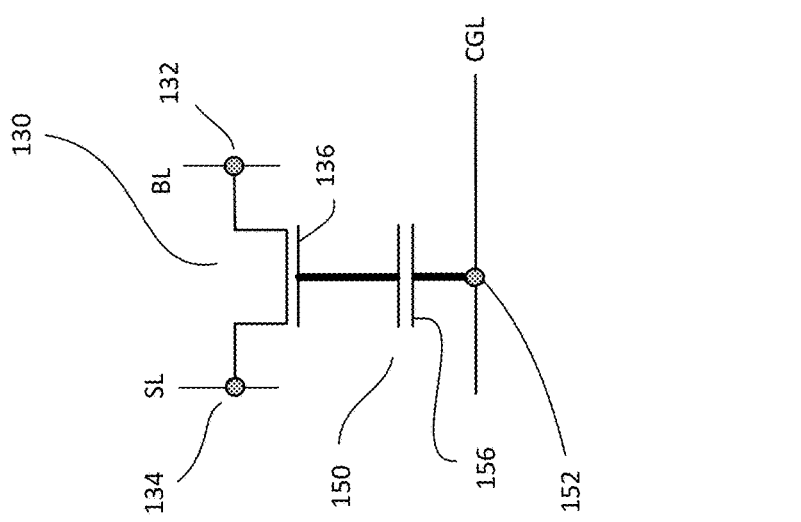
FIG. 1 shows a schematic diagram of an embodiment of a memory cell.

FIG. 1 shows a schematic diagram of a portion of an embodiment of a device. The device is, for example, a non-volatile memory (NVM) device. Other types of devices may also be useful. The NVM device, in one embodiment, includes a multi-time programmable (MTP) memory cell 100. As shown in FIG. 1, the memory cell 100 includes a transistor 130 coupled to a capacitor 150. The transistor is, for example, metal oxide semiconductor (MOS) transistor. In one embodiment, the transistor functions as a storage element. The transistor 130, for example, serves as a storage transistor.

The transistor includes a gate between first and second source/drain (S/D) regions. For example, the storage transistor 130 includes a first S/D region 132, a second S/D region 134 and a storage gate 136. The S/D regions of a transistor are heavily doped regions with first polarity type dopants. The polarity type determines the type of transistor. For example, the first polarity may be n-type for a n-type transistor or p-type for a p-type transistor. A gate includes a gate electrode and a gate dielectric. The storage gate 136 may be referred to as a floating gate.

In one embodiment, the capacitor 150 is a MOS capacitor. The MOS capacitor, for example, includes a control gate 156 with a control gate electrode and a control gate dielectric. In one embodiment, the capacitor 150 is a voltage coupling (or control) capacitor. The control gate 156 facilitates in forming the control capacitor 150. The control capacitor serves as the program and read terminal of the memory cell 100.

The control capacitor includes first and second control capacitor plates separated by at least a capacitor dielectric. The control gate, for example, serves as the first (or control gate) capacitor plate while the second capacitor plate will be described in more detail with reference to FIGS. 2a-2d, 3, 4a-4b, and 5a-5i. At least one control contact region 152 is provided for the control capacitor. A control contact region may be a heavily doped region disposed adjacent to the control gate 156. For example, the control contact region is heavily doped with capacitor type dopants. A control contact region 152 minimizes contact resistance to the first capacitor plate and serves to couple the first capacitor plate to a control gate line (CGL). In one embodiment, a second contact region serves to couple the second capacitor plate to the CGL. The second contact region is, for example, a back contact region, which will be described in detail later. For example, the first and second capacitor plates of a memory cell are separately coupled to a common control gate line (CGL).

The control gate 156 is directly coupled to the storage gate 136. In one embodiment, a common gate conductor couples the control and storage gates. For example, the same gate layers (i.e. gate dielectric and gate electrode layers) form the control gate 156 and storage gate 136. In one embodiment, the gate dielectric layer of the storage and control gates includes the same thickness. The gate dielectric layer, for example, includes a thickness suitable for medium voltage (MV) devices. Other suitable thickness dimensions may also be useful. For example, the gate dielectric layer may also include a thickness suitable for high voltage (HV) devices.

The first S/D region 132 of the storage transistor 130 is coupled to a bit line (BL) of the device while the second S/D region 134 of the storage transistor is coupled to a source line (SL) of the device. For example, the first S/D region may serve as a drain terminal and the second S/D region may serve as a source terminal of the NVM device. The control contact region 152 and back contact region of a control capacitor is coupled to a common control gate line (CGL) of the NVM device. For example, the control contact region may serve as a control gate terminal of the NVM device. In one embodiment, the CGL is disposed along a first direction, such as a wordline direction, while the SL and BL are disposed along a second direction, such as the bitline direction. The first and second directions, for example, are orthogonal to each other. Other configurations of BL, SL and CGL may also be useful.

Figure 2A:
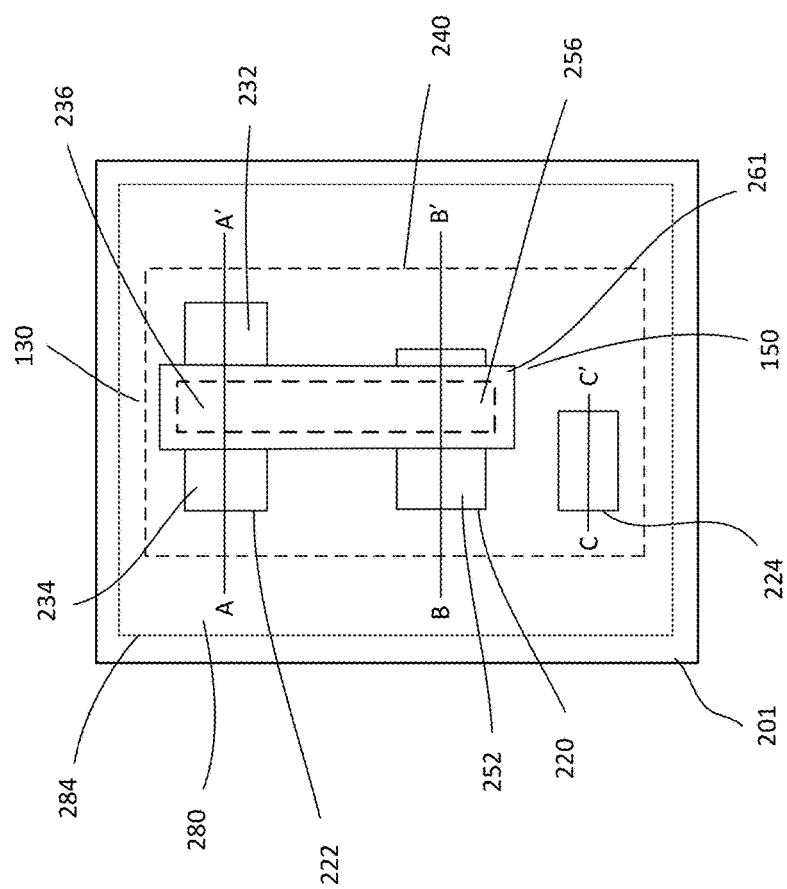
FIG. 2a shows a top view of an embodiment of a memory cell and FIGS. 2b-2d show various cross-sectional views of an embodiment of the memory cell.
Figure 2B:
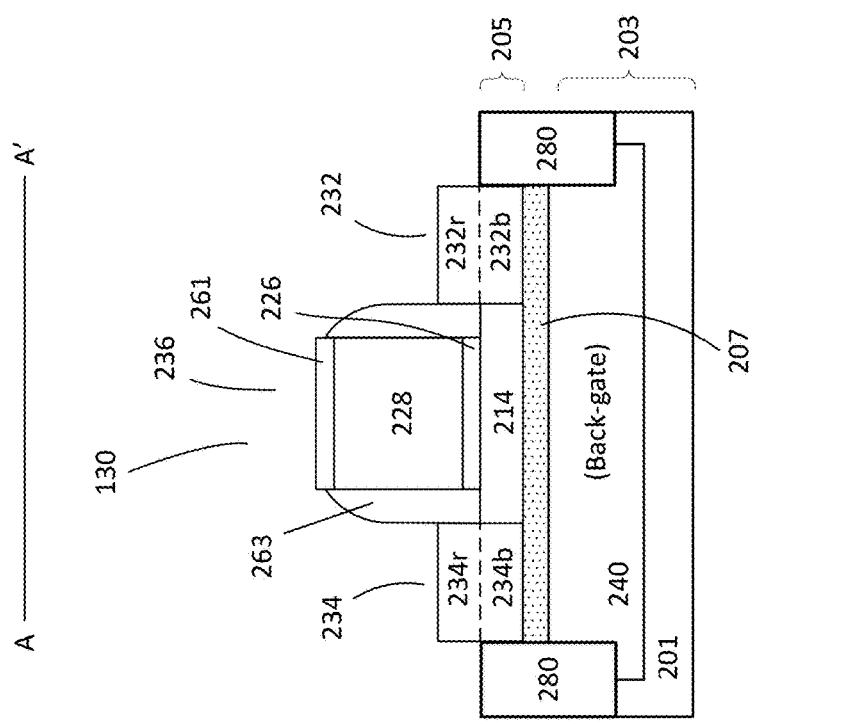
Figure 2C:
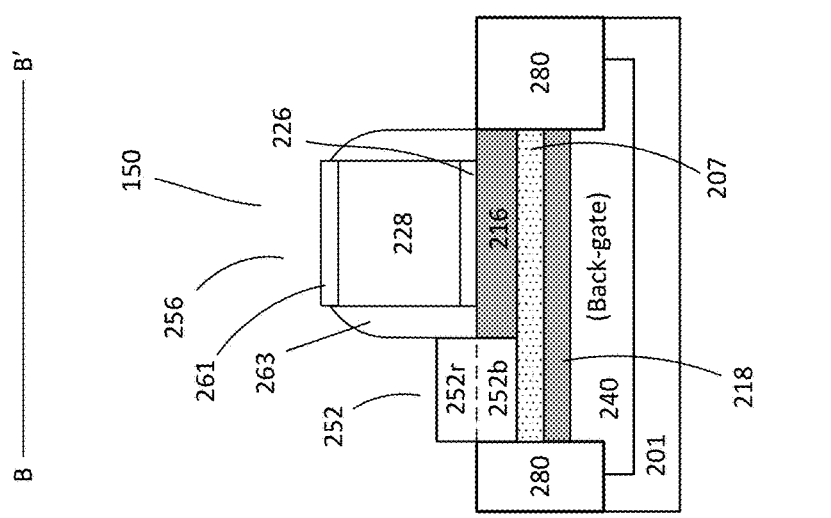
Figure 2D:
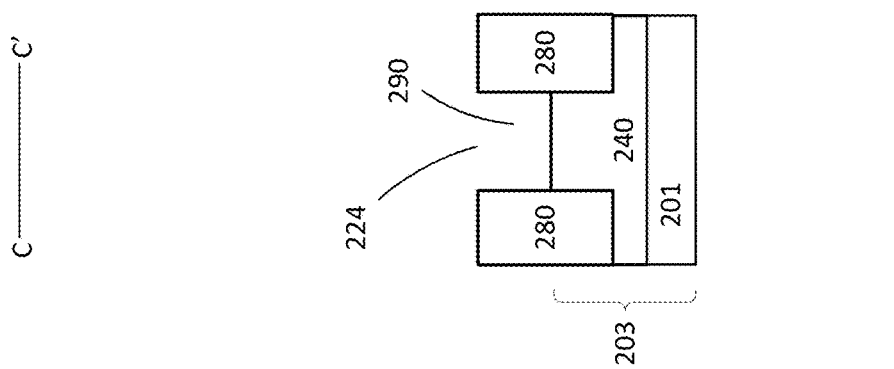

FIG. 2a shows a top view of an embodiment of a memory cell 200 of a device and FIG. 2b-2d show various cross-sectional views of the memory cell. The cross-sectional views are, for example, along A-A' and B-B' of the memory cell. The memory cell 200 is, for example, the same or similar to that described in FIG. 1. In the interest of brevity, common elements and features having the same reference numerals may not be described or described in detail. The memory cell 200 as shown may be a portion of a memory device. For example, the memory cell is a non-volatile MTP memory cell of a memory device.

The device may include doped regions having different dopant concentrations. For example, the device may include heavily doped ($x^+$), intermediately doped (x) and lightly doped ($x^-$) regions, where x is the polarity type which can be p-type or n-type dopants. A lightly doped region may have a dopant concentration of about $1E11\text{-}5E12\ cm^{-2}$, an intermediately doped region may have a dopant concentration of about $5E12\text{-}5E13\ cm^{-2}$, and a heavily doped region may have a dopant concentration of about $5E13\text{-}5E15\ cm^{-2}$. Providing other dopant concentrations for the different types of doped regions may also be useful. For example, the dopant concentration range may be varied, depending on the technology node. P-type dopants may include boron (B), fluorine (F), aluminum (Al), indium (In) or a combination thereof, while n-type dopants may include phosphorous (P), arsenic (As), antimony (Sb) or a combination thereof.

The substrate 201 may serve as a base of the memory cell 200. In one embodiment, the substrate includes a surface crystalline layer 205 separated from a bulk crystalline layer 203 by an insulator layer 207. The substrate 201, for example, is a crystalline-on-insulator (COI) substrate. The COI substrate may be a silicon-on-insulator (SOI) substrate. Other suitable types of COI substrates, such as germanium-on-insulator (GeOI) substrate, may also be useful. As for the insulator layer, it may be formed of a dielectric material. The insulator layer, for example, includes silicon oxide, which provides a buried oxide (BOX) layer 207. Other types of dielectric materials may also be useful. It is understood that the surface and bulk crystalline layers need not be formed of the same material. The surface crystalline layer 205 may be referred to as the body substrate and the bulk crystalline layer 203 may be referred to as the base substrate.

The substrate 201, in one embodiment, employs a very thin body substrate 205 and a very thin BOX layer 207. For example, the body substrate 205 is a very thin silicon body. In one embodiment, the thickness of the body substrate is about 5-10 nm, while the thickness of the BOX layer is about 10-30 nm. This forms an ultra-thin body SOI substrate, such as a fully depleted SOI (FDSOI) substrate. Providing an ultra-thin body SOI substrate enables better control of a transistor channel region 214, which will be described in greater detail later. Other suitable thickness dimensions for the body substrate and BOX layer may also be useful as long as they are sufficiently thin to provide improved control of the transistor channel region.

The substrate 201 is prepared with a cell region 284 in which the memory cell 200 is disposed. The cell region 284 includes a cell size sufficient to accommodate the memory cell 200. The cell size may depend on the technology node of the device. The device is, in one embodiment, designed for 32 nm nodes and below. For example, the memory cell 200 relates to 28 nm and/or 22 nm technology nodes. It is understood that the memory cells 200, as will be described, may also relate to other suitable technology nodes, depending on design requirements.

Although one cell region is shown, it is appreciated that the device may include a plurality of cell regions having memory cells interconnected to form a memory array. Additionally, the substrate may include other types of device regions, depending on the type of device or IC. For example, the device may include device regions for high voltage (HV), medium voltage (MV) and/or low voltage (LV) devices. The substrate may also include regions for other types of devices, depending on the type of IC or design requirements.

An isolation region 280 is provided to separate the cell region 284 from other device regions. In one embodiment, the isolation region defines the active regions in the substrate 201. An active region includes, for example, a predefined silicon region of the SOI substrate 201. For example, the isolation region defines an active transistor region 222, an active capacitor region 220, and an active contact region 224. In one embodiment, the isolation region is provided to isolate memory cells from each other. For example, a memory cell formed in a cell region is isolated from other cell regions by an isolation region. Other suitable configurations of isolation regions may also be useful. As shown, the isolation region 280 extends from the top surface of the substrate 201 to a depth below the BOX layer 207. In one embodiment, the isolation region includes a depth from the top of the substrate 201. The depth of the isolation region is, for example, about 50 nm from the top surface of the body substrate 205. Providing isolation regions having a depth of more than 50 nm may also be useful, depending on design requirements. The isolation region is, for example, shallow trench isolation (STI) region. Other types of isolation regions, such as deep trench isolation region, may also be useful.

A storage transistor 150 is disposed on the active transistor region 222. The transistor includes a storage gate 236 disposed between first and second S/D regions 232 and 234. In one embodiment, the S/D regions are heavily doped with transistor type dopants. The S/D regions, for example, include dopants of the same polarity type as the transistor polarity type. For example, first polarity type transistors have S/D regions with first polarity type dopants. The storage gate 236 is disposed on the body substrate 205 while the S/D regions are disposed adjacent to the gate within the active transistor region. The storage gate includes a gate electrode 228 over a gate dielectric 226. The gate electrode 228, for example, may be a polysilicon gate electrode and the gate dielectric 226 may be a silicon oxide gate dielectric. Other types of gate electrode or dielectric materials may also be useful. The storage gate 236 may be referred to as a floating gate.

A control capacitor 130 is disposed on the active capacitor region 220. As shown in FIG. 2c, the control capacitor includes a control gate 256 disposed between a control contact region 252 and an isolation region 280. For example, an isolation region 280 is positioned adjacent to a first side of the control gate and the control contact region 252 is positioned adjacent to a second side of the control gate. In one embodiment, the control contact region is heavily doped with capacitor type dopants. The control contact region, for example, includes dopants of the same polarity type as the capacitor polarity type. The control gate includes a gate electrode 228 over a gate dielectric 226. The gate electrode 228, for example, may be a polysilicon gate electrode and the gate dielectric 226 may be silicon oxide gate dielectric. Other types of gate electrode or dielectric materials may also be useful. The control gate, in one embodiment, is doped with capacitor type dopants. For example, the gate electrode is heavily doped with n-type dopants for an n-type capacitor.

The control gate 256 may be directly coupled to the storage gate 236 by a gate conductor. In one embodiment, a gate conductor forms the control and floating gates. For example, a common gate electrode layer and a common gate dielectric layer extend over the cell region 284 to form the control gate 256 and storage gate 236. In one embodiment, the gate dielectric 226 of the storage and control gates includes a thickness suitable for medium voltage devices. Other suitable thickness dimensions of gate dielectric may also be useful. For example, the gate dielectric may also include a thickness suitable for high voltage (HV) devices.

Dielectric spacers 263 may be provided on the sidewalls of the storage and control gates. The spacers 263 may be used to facilitate forming contact regions disposed within the active transistor and active capacitor regions 222 and 220. For example, the spacers facilitate forming transistor S/D regions and control contact region.

A control contact region 252 is disposed in the active capacitor region 220. Although only one control contact region is illustrated, it is understood that other suitable number of control contact regions may also be useful, depending on the desired cell size. In one embodiment, the control contact region is a heavily doped region disposed adjacent to a side of the control gate. The control contact region is, for example, heavily doped with capacitor type dopants. In one embodiment, the control contact region 252 is disposed adjacent to the control gate 256 without underlapping the control gate. For example, the control contact region may be positioned away from a second sidewall of the gate and self-aligned with an outer edge of a sidewall spacer 263 disposed on the second side of the control gate 256. Other configurations of the control contact region may also be useful.

In one embodiment, the transistor S/D regions 232 and 234 include similar configurations as the control contact region 252. For example, the S/D regions 232 and 234 are disposed adjacent to the storage gate 256 without underlapping the gate. The transistor S/D regions may be positioned away from sidewalls of the storage gate 236 and self-aligned with an outer edge of the sidewall spacers 263 disposed on first and second sides of the storage gate. In one embodiment, the active transistor region includes S/D extension regions (not shown) which extend from the S/D regions 232 and 234 to underlap a portion of the storage gate. The S/D extension regions include, for example, halo and lightly doped drain (LDD) regions. A halo region is a lightly doped region with second polarity type dopants for a first polarity type transistor. As for the LDD region, it is a lightly doped region with transistor type dopants. For example, the halo region includes p-type dopants for a n-type transistor while the LDD region includes n-type dopants for a n-type transistor. The dopant concentrations of the halo and LDD regions are lower than the S/D regions. In general, the dopant concentration of the LDD is heavier or higher than the halo region. The dopant concentrations of the LDD and halo regions may be varied depending on the technology node. Other configurations of S/D extension regions may also be useful. For example, providing only a LDD region without halo region may also be useful.

In one embodiment, the transistor S/D regions 232 and 234, as well as the control contact region 252, include base and raised portions. For example, the first S/D region 232 includes a raised S/D portion 232r on a base S/D portion 232b; the second S/D region 234 includes a raised S/D portion 234r on a base S/D portion 234b; and the control contact region 252 includes a raised contact portion 252r on a base contact portion 252b. In on embodiment, the base portions are doped substrate portions disposed within the body substrate 205 while the raised portions are doped epitaxial layers disposed on the body substrate. The raised portions may about the gate spacers 263. The raised portions, for example, include a thickness lower than a height of the gate. For example, the thickness of the raised portions may be about 10-100 nm. Other suitable thickness ranges may also be useful.

In one embodiment, a channel region 214 of the storage transistor 150 is disposed between the first and second S/D regions 232 and 234. For example, the channel region underlaps the storage gate 236 and is in communication with the first and second S/D regions. A length of the channel region ($L_C$) extends along a first direction (e.g., channel length direction) connecting the first and second S/D regions, while a width of the channel region ($W_C$) extends along a second direction (e.g., channel width direction) which is parallel to the gate conductor and perpendicular to the first direction. Both length and width of the channel lie in a plane, parallel to the device surface.

The storage gate may be disposed on a lightly doped portion of the body substrate. For example, the storage transistor includes a lightly doped channel region 214. The channel region, in one embodiment, is disposed within the body substrate of a fully depleted SOI (FDSOI) substrate. The channel region 214 is, for example, a fully depleted thin channel region. Other configurations of the channel region may also be useful. Providing the storage transistor 150 with a fully depleted thin channel region improves short channel effects (SCE) and drain current leakage.

In one embodiment, the active capacitor region 220 includes a first doped region 216. For example, the control gate 256 is disposed on an intermediately doped portion of the body substrate 205. The dopant concentration of the first doped region is, for example, about 5E12-5E13 $cm^{-2}$. Other dopant concentrations of first doped region may also be useful. The first doped region 216 is disposed in the body substrate within the active capacitor region 220. As shown, the first doped region 216 underlaps the control gate 256 and extends from the control contact region 252 (e.g. base contact portion) to the isolation region 280 positioned adjacent to the first side of the control gate 256. The first doped region 216 serves as a capacitor well of the control capacitor 150 and may be referred to as a control well. The polarity type of a capacitor well may depend on the polarity type of the control capacitor 150. In one embodiment, the first doped region includes capacitor type dopants. For example, the control well includes n-type dopants for a n-type control capacitor or p-type dopants for a p-type control capacitor. Other configurations of capacitor well and MOS capacitor may also be useful.

A second doped region 218 may be disposed in the active capacitor region and below the first doped region 216. In one embodiment, the second doped region 218 is disposed in an upper portion of the base substrate 203 and underlaps the control contact region 252 and first doped region 216. For example, the second doped region extends from a bottom of the BOX layer 207 to a depth within the base substrate 203. The second doped region, for example, extends to a depth shallower than a depth of the isolation region 280. Providing the second doped region with a depth same as or deeper than the isolation region may also be useful. In one embodiment, a single implant process is employed to simultaneously form the first and second doped regions 216 and 218. For example, the first and second doped regions may include about the same dopant concentration. The dopant concentration of the second doped region is, for example, about 5E12-5E13 $cm^{-2}$. Other configurations or dopant concentrations of the second doped region may also be useful. The second doped region 218 serves as a doped back plane (BP) of the control capacitor 150.

A device well 240 may be provided within the cell region 284. For example, the device well is disposed within the base substrate 203. In one embodiment, the device well includes first polarity type dopants. The first polarity type may be the same polarity type as the capacitor polarity type. For example, the device well is doped with n-type dopants for a n-type capacitor. The dopant concentration of the device well is, for example, about 1E10-1E12 $cm^{-2}$. Other dopant concentrations may also be useful. As shown, the device well 240 includes a depth deeper than the isolation region 280. The device well, for example, extends below the isolation region 280 and traverses the active capacitor and active transistor regions to underlap the storage and control gates 236 and 256. The device well may form back-gates embedded in the base substrate 203 within the active regions of the cell region 284. In one embodiment, the device well 240 forms a back-gate of the capacitor 130 and the transistor 150. For example, a capacitor back-gate may be defined by the portion of device well which traverses the active capacitor region 220 and underlaps the second doped region 218, while a transistor back-gate may be defined by the portion of device well which traverses the active transistor region 222, and underlaps the channel region 214.

In one embodiment, the device well extends laterally beyond the active capacitor region to define an active contact region 224 within the base substrate. The active contact region may be a back contact region 224. The back contact region 224 is, for example, a contact region of the device well 240. In one embodiment, the active contact region is disposed adjacent to the active capacitor region. For example, an isolation region 280 separates the active contact region 224 from the active capacitor region 220. A trench region 290 is disposed within the substrate 201 to expose the back contact region 224. The trench region is, for example, disposed over the active contact region and extends from the top of the body substrate 205 to the top of the base substrate 203. The back contact region, for example, serves as a contact region for biasing the capacitor back-gate during program operations. In this case, the portion of BOX layer 207 in the active capacitor region serves as a gate dielectric (or back-gate dielectric) of the capacitor back-gate. For example, the back-gate dielectric is disposed between the first and second doped regions 216 and 218. In some embodiments, the back contact region serves as contact region for biasing the transistor back-gate during read operations. Providing a transistor back-gate below the channel region 214 advantageously provides the transistor 130 with back-biasing to improve transistor performance. For example, the transistor back-gate improves read operations of the memory cell.

The control gate 256 forms the control capacitor 150. The control capacitor, in one embodiment, includes first and second capacitor plates separated by a capacitor dielectric. For example, the control gate electrode serves as the first capacitor plate and the capacitor back-gate serves as the second capacitor plate, while the BOX layer (i.e., back-gate dielectric) in the active capacitor region serves as the capacitor dielectric. A contact plug (not shown) may extend through the trench region 290 to couple the capacitor back-gate 240 to the CGL of the memory cell 200. The CGL, in one embodiment, is directly coupled to the back contact region and the control contact region 252. The second doped region (or back plane) 218 is, for example, biased through the control contact region 252. In such case, a control gate dielectric capacitance ($C_{OX}$) will be in serial association with a buried oxide capacitance ($C_{BOX}$) to result in improved coupling capacitance at the control gate. The coupling ratio of the control gate ($CR_{CG}$) may be illustrated by the following equation:

$$CR_{CG} = \frac{C_{CG}}{C_{CG} + C_{ox} \parallel C_{BOX}}$$

where, $C_{CG}$ is the capacitance of the control gate 256. This capacitor configuration improves the capacitive coupling ratio (CR) at the control capacitor without increasing the capacitor footprint. This can be attributed to the fact that the capacitance of the buried oxide layer ($C_{BOX}$) is much smaller as compared to $C_{OX}$ and $C_{CG}$.

Metal silicide contacts (not shown) may be provided on contact regions of the memory cell. The metal silicide contacts, for example, may be nickel or nickel-based metal silicide contacts. Other suitable types of metal silicide contacts, including cobalt or cobalt-based metal silicide contacts, may also be useful. In one embodiment, metal silicide contacts are provided on the transistor S/D regions, control contact region and back contact region. A silicide block may be disposed over the common gate conductor of the cell region. In one embodiment, a silicide block 261 is disposed on the storage and control gates. The silicide block, for example, is a dielectric material, such as silicon oxide or silicon nitride. Other types of silicide blocks may also be useful. Providing a silicide block over the storage and control gates prevents formation of silicide contacts over these gates. This improves data retention.

The first transistor S/D region 232 is coupled to a BL. The second transistor S/D region 234 is coupled to a SL. The control contact region 252 and back contact region are commonly coupled to a CGL. In one embodiment, the CGL is disposed along a first direction, such as a wordline (WL) direction, while the SL and BL are disposed along a second direction, such as the bitline (BL) direction which is perpendicular to the WL direction. Other configurations of SL, BL and CGL may also be useful.

The various conductive lines of the memory cell may be disposed in metal levels of the device or IC. Conductive lines disposed in the same direction may be provided in the same metal level. For example, conductive lines disposed along the BL direction may be disposed in metal level $M_X$ while conductive lines disposed along the WL direction may be disposed in $M_{X+1}$ of the device. Other configurations of conductive lines and metal levels may also be useful.

Figure 3:
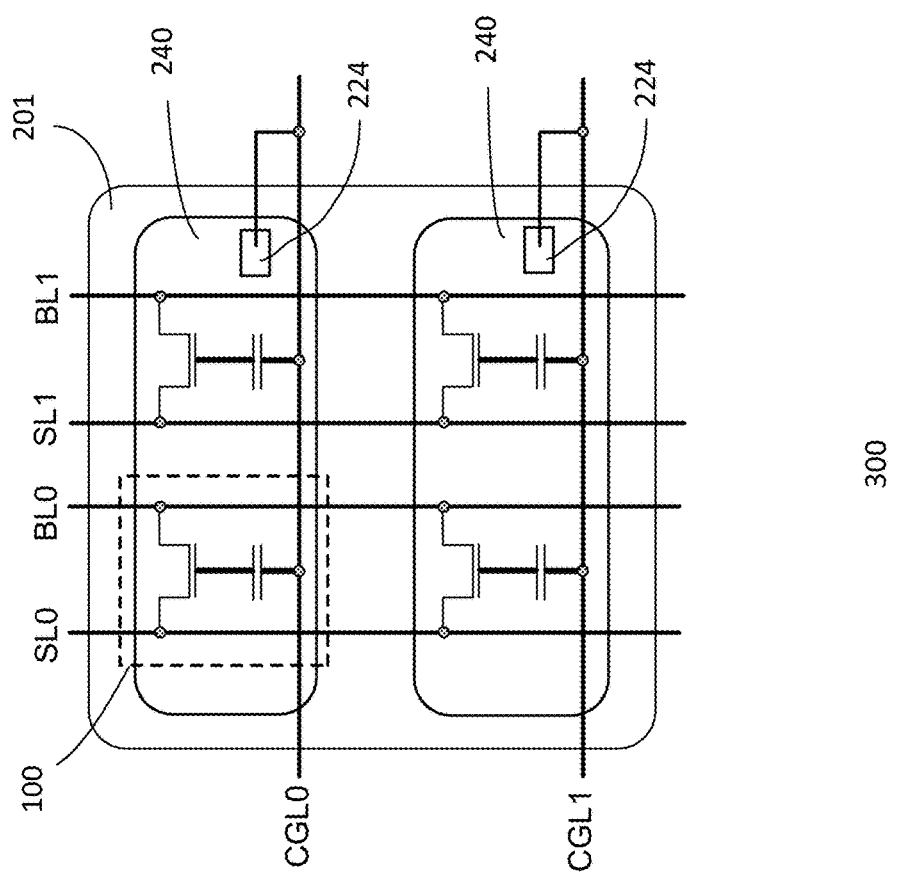
FIG. 3 shows a schematic diagram of an embodiment of a memory array.

FIG. 3 shows a schematic diagram of an embodiment of a memory array 300 of a device. The device is, for example, an NVM device. A portion of the array is shown with, for example, four memory cells 100, such as those described in FIGS. 1 and 2a-2d. In the interest of brevity, common elements and features having the same reference numerals may not be described or described in detail.

The array of memory cells may be formed on a SOI substrate having active transistor and capacitor regions. In one embodiment, the SOI substrate includes a device well 240. The device well may define the back-gates of a memory cell. In one embodiment, the device well defines a capacitor back-gate and a transistor back-gate. A device well may include a back contact region 224 for biasing the back-gates. In one embodiment, the device well 240 may extend along a row of interconnected memory cells of an array to provide a common device well, as shown. For example, the cell regions of each row of memory cells include a common device well. Other configurations of device well may also be useful.

Although one back contact region 224 is illustrated for a device well 240, it is understood that each row of memory cells may also be provided with multiple back contact regions disposed in the device well, depending on design requirements.

As shown, the memory cells are interconnected to form two columns connected by BLs (BL0 and BL1) and SLs (SL0 and SL1) and two rows of memory cells connected by CGLs (CGL0 and CGL1). In one embodiment, the SLs (SL0 and SL1) of each column of memory cells are coupled to separate source terminals. For example, SL0 and SL1 are coupled to first and second source terminals and BL0 and BL1 are coupled to first and second bitline terminals. In one embodiment, the CGL of each row of memory cells is commonly coupled to the control contact region and back contact region of the device well. For example, a control terminal of a CGL provides a common bias to the control gate and capacitor back-gate of the row of memory cells.

Although a 2×2 portion of an array is shown, it is understood that the array may include numerous rows and columns. For example, the memory array may form a memory block. The memory array may also include other suitable types of array configurations.

The memory cell of FIGS. 1 and 2a-2d, in one embodiment, is configured to include a first type transistor and a first type capacitor for a second type SOI substrate. For example, the storage transistor is the same polarity type to that of the control capacitor. In one embodiment, the first polarity type is n-type and the second polarity type is p-type. For example, the memory cell is configured with a n-type transistor and a n-type capacitor while the SOI substrate includes an oxide layer sandwiches between a p-type body substrate and a p-type base substrate. Other configurations of the memory cell may also be useful. For example, the first polarity type may be p-type and the second polarity type may be n-type. The SOI substrate may be a very thin SOI substrate, such as a fully depleted SOI (FDSOI). The transistor S/D regions and control contact region are n-type. Furthermore, the common gate electrode is doped with capacitor type dopants. For example, the gate electrodes of the transistor and capacitor gates are doped with first polarity type or n-type dopants.

Figure 4B:
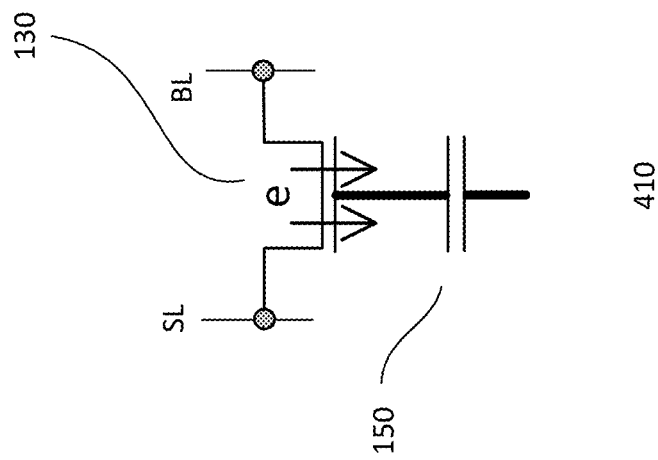
FIGS. 4a-4b show various operations of an embodiment of a memory cell.
Figure 4A:
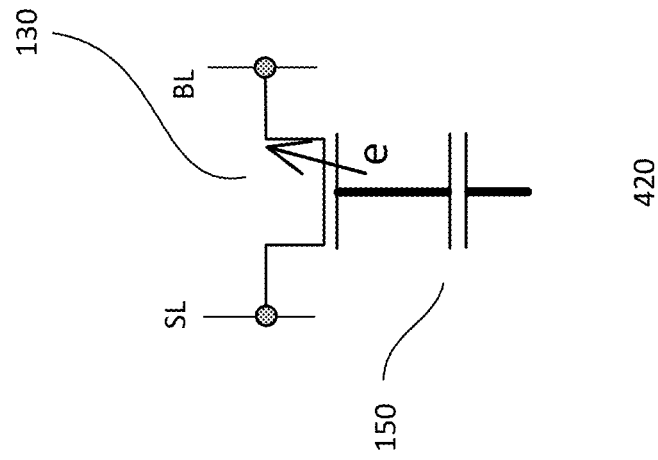

FIGS. 4a-4b show various operations of an embodiment of a memory cell 100. The memory cell as shown may be a portion of a memory device. The memory cell 100 is, for example, the same or similar to those described in FIGS. 1, 2a-2d and 3. In the interest of brevity, common elements and features having the same reference numerals may not be described or described in detail.

In one embodiment, a memory cell with a first type transistor and a first type capacitor may include various operating modes. The first type is, for example, n-type. The memory cell includes a control capacitor coupled to a storage gate. Table 1 below shows various biasing voltages at various terminals of a memory cell for program, erase and read operating modes:

TABLE 1

| Signals | CGL | | BL | | SL | |
|---|---|---|---|---|---|---|
| Modes | sel | unsel | sel | unsel | sel | unsel |
| PGM: FN (bit) | $V_{PGM}$ | 0V | 0V | $V_{INH}$ | 0V | $V_{INH}$ |
| ERS: FN (block or column) | 0V | 0V | $V_{ERS}$ | $V_{ERS}$ | 0V | 0V |
| Read | $V_{DD}$ | 0V | $V_{DD}$ | 0V | 0V | 0V |

The voltage values for the different signals may depend on the gate oxide thickness of the floating gate and control gate. The voltage values applied to the various terminals of a memory cell may include any suitable voltages using, for example, Fowler-Nordheim (FN) tunneling for program and erase operations. As an illustration, a gate oxide thickness of about 125 Å may accommodate an operating voltage ($V_{DD}$) of about 5V, a program ($V_{PGM}$) or erase voltage ($V_{ERS}$) of about 16V, or an inhibiting voltage ($V_{INH}$) equal to about 8V. Other suitable voltage values for other gate oxide thicknesses may also be useful.

The memory cell may operate in a Fowler-Nordheim (FN) tunneling program mode 410, as shown in FIG. 4a. To effect a FN tunneling program operation, the various select (sel) signals for such a program operation are provided at the various terminals of the selected memory cell. In the program mode, electron carriers tunnel through from the transistor channel region to the floating gate (FG). Other suitable types of programming modes, such as channel hot electron (CHE) injection programming mode, may also be useful.

The memory cell may operate in FN tunneling erase mode 420, as shown in FIG. 4b. To effect a FN tunneling erase mode, the various sel signals for such an erase operation are provided at the various terminals of the selected memory cell. In the erase mode, electron carriers move from the FG to the transistor channel region and further to the drain region. For example, the drain region which is coupled to the BL serves as an erase terminal. The erase mode may effect a memory block or sector erase operation.

As for a read operation, the various sel signals for a read operation are provided at the various terminals of the selected memory cell to effect the read operation.

The memory cell as described in FIG. 1 and FIGS. 2a-2d results in advantages. For example, providing memory cells with an FDSOI substrate improves short-channel effects (SCE). A capacitor back-gate may also be embedded in the base substrate of an FDSOI substrate to provide a control capacitor configuration, which includes a buried oxide capacitance ($C_{BOX}$) coupled in series with a capacitance of the control gate dielectric ($C_{OX}$). This improves performance of the memory cell through a higher capacitive coupling ratio at the control gate ($CR_{CG}$). For example, $CR_{CG}$ may be improved by about 50% as compared to control capacitor configurations for planar bulk memory structures, which do not include a $C_{BOX}$ in series with $C_{OX}$. In addition, providing raised contact regions (e.g., S/D regions and control contact region) further improves coupling capacitance and memory cell performance. Furthermore, integrating a doped back plane (BP) below the control capacitor provides the memory cell with increased threshold voltage options, as illustrated by Table 1. The configuration and arrangement of the memory cell as described also provides a highly efficient erase performance which is not limited by junction breakdown voltage (BV). For example, the buried oxide layer of the FDSOI substrate increases junction BV in comparison to bulk silicon substrates. This potentially reduces the number of terminal voltages.

FIGS. 5a-5i show cross-sectional views of an embodiment of a process 500 for forming a device. The process includes forming a memory cell of the device. The process, in one embodiment, forms a memory device, such as a NVM device. The memory cell is, for example, an NVM MTP cell, which is the same or similar to those described in FIGS. 1, 2a-2d, 3 and 4. In the interest of brevity, common elements and features having the same reference numerals may not be described or described in detail.

Figure 5A:
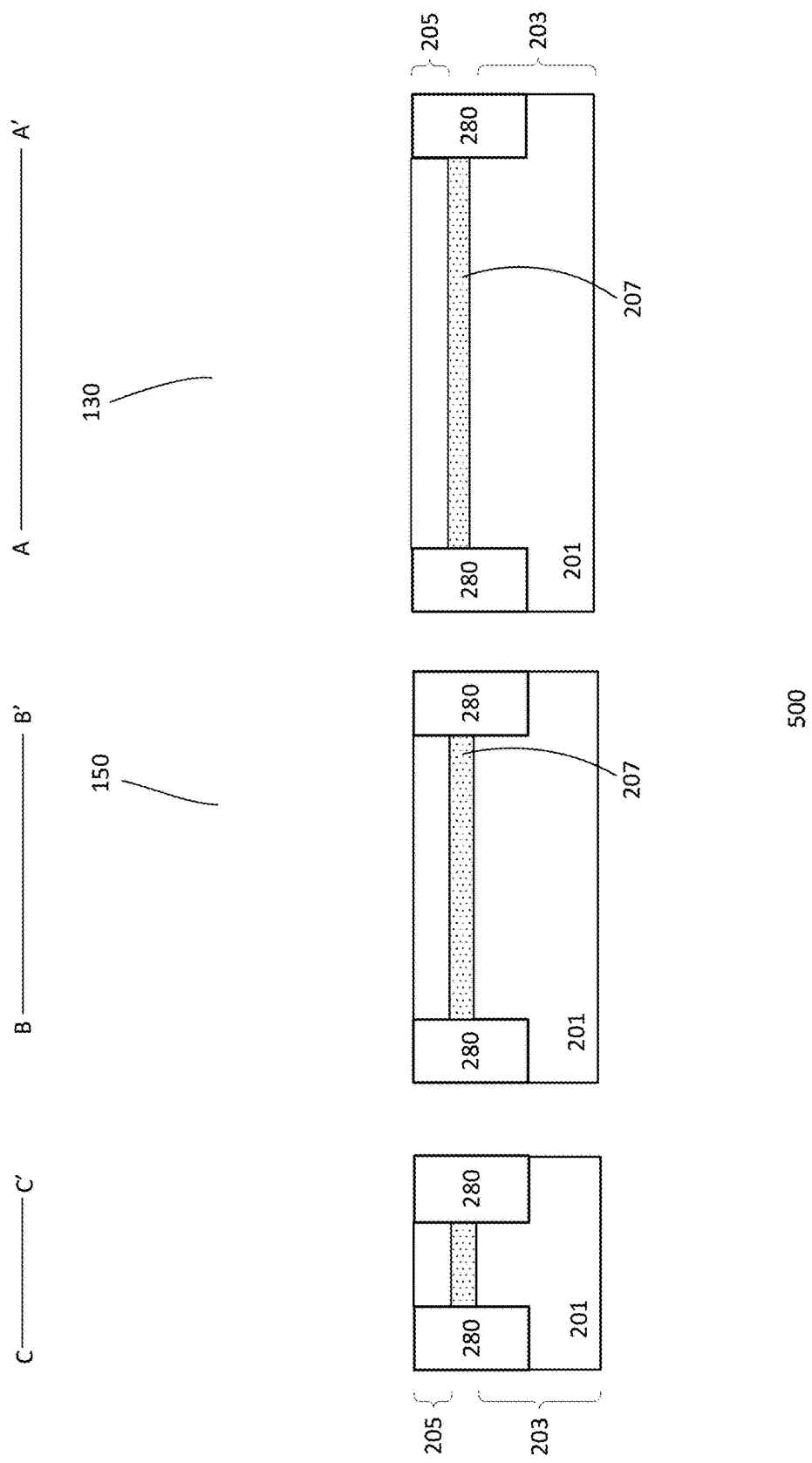
FIGS. 5a-5i show cross-sectional views of an embodiment of a process for forming a memory cell.

Referring to FIG. 5a, a substrate 201 is provided. The substrate, for example, is a crystalline-on-insulator (COI) substrate. The COI substrate includes a surface crystalline layer 205 separated from a crystalline bulk 203 by an insulator layer 207. The surface crystalline layer may be referred to as the body substrate 205 and the bulk crystalline layer may be referred to as the base substrate 203. The insulator layer 207, for example, may be formed of a dielectric insulating material. The insulator layer, for example, includes silicon oxide, which provides a buried oxide (BOX) layer 207. Other types of dielectric insulating materials may also be useful. The COI substrate may be a silicon-on-insulator (SOI) substrate, such as an ultra-thin SOI substrate. In some embodiments, the COI substrate is a FDSOI substrate. An FDSOI substrate includes, for example, a hybrid SOI structure having a base substrate layer 203 lightly doped with second polarity type (or p-type) dopants and an undoped fully depleted body substrate 205. Other suitable types of COI substrates may also be useful.

A cell region of a memory cell is isolated from another cell region by isolation regions 280, such as shallow trench isolation (STI) regions. The isolation regions may define active regions within a cell region. In one embodiment, a cell region may be provided with an active transistor region 222, an active capacitor region 220, and an active contact region 224. For example, isolation regions isolate the various active regions and other device regions, such as HV, MV and/or LV devices. Various processes can be employed to form the STI regions 280. For example, the substrate can be etched using etch and mask techniques to form trenches. The mask, for example, includes a pad oxide and silicon nitride hard mask which is patterned using a patterned photoresist mask. The substrate is etched using, for example, an anisotropic etch, such as a reactive ion etch (RIE) to form the trenches. Other techniques for patterning the substrate may also be useful. The trenches are then filled with dielectric material, such as silicon oxide. Chemical mechanical polishing (CMP) can be performed to remove excess dielectric material and provide a planar substrate top surface. Other processes or materials can also be used to form the isolation regions.

Figure 5B:
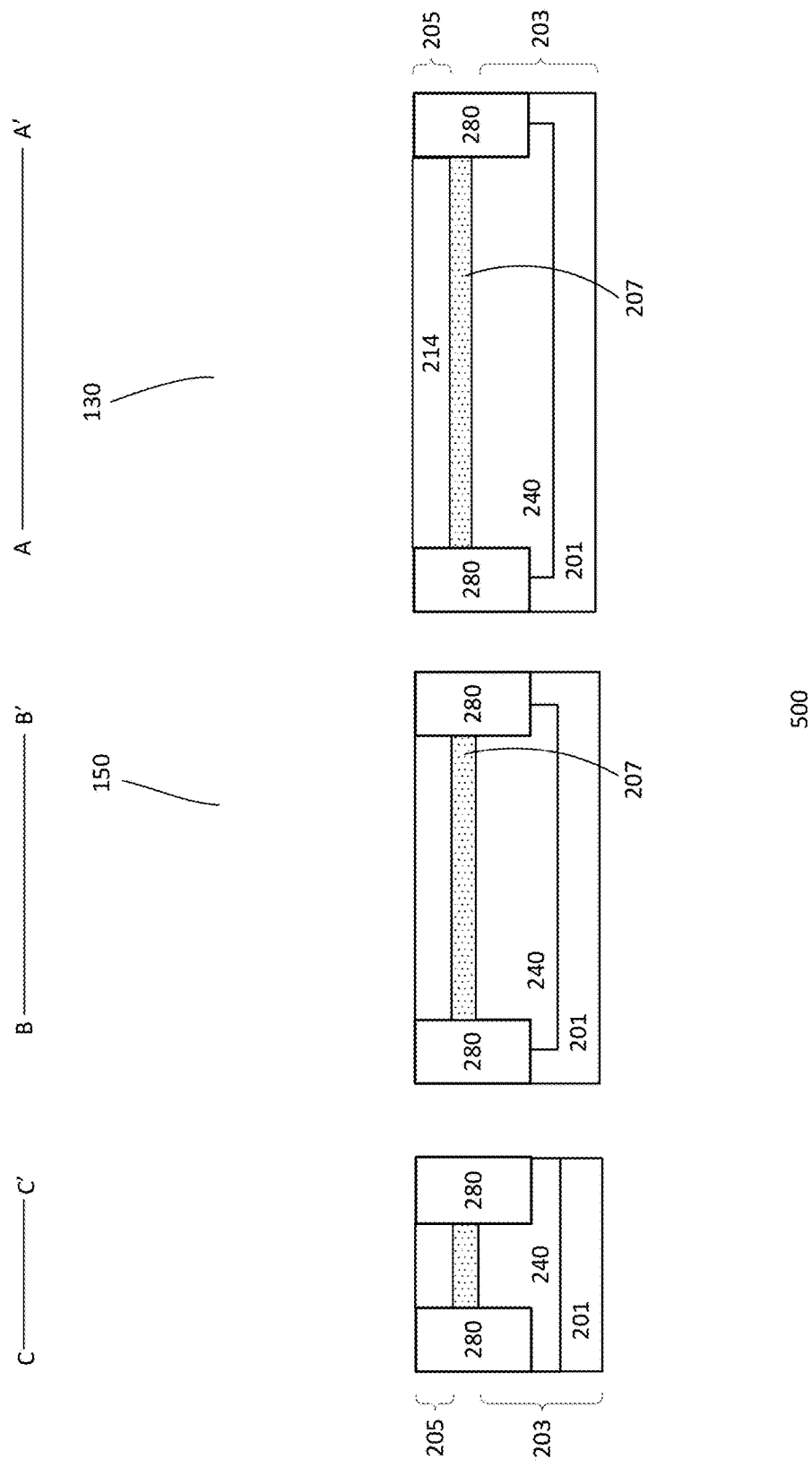

Referring to FIG. 5b, a first implantation process is performed. In one embodiment, first polarity type dopants are deeply implanted to form a lightly doped region corresponding to the device well 240 in the substrate 201. The first polarity type dopants, for example, include n-type dopants. The implant process may include suitable implant energy and implant dosage to simultaneously form the device well 240 in the base substrate and the transistor channel region 214 in the body substrate. For example, the doped region 240 may include a dopant concentration of about 1E10-1E12 $cm^{-2}$. Other dopant concentrations may also be useful. The dopant concentration may depend on, for example, the operational voltage requirements. Preferably, the device well 240 is sufficiently doped to accommodate a biasing voltage for programming operations $V_{PGM}$.

Figure 5C:
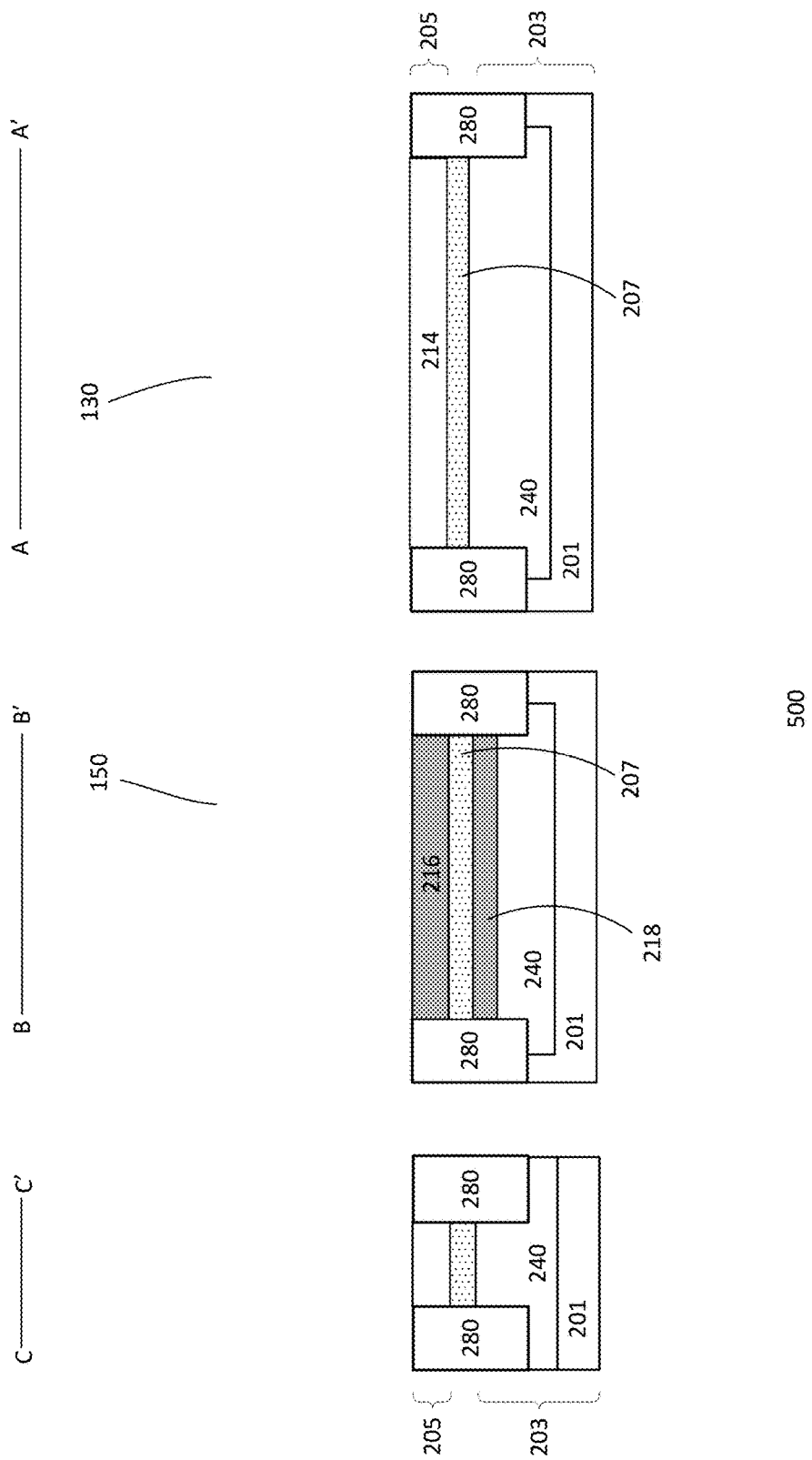

Referring to FIG. 5c, a second implantation process is performed. In one embodiment, capacitor type dopants are implanted into active capacitor region of the SOI substrate to simultaneously form the first and second doped regions 216 and 218. Other techniques may also form the first and second doped regions. For example, separate implant processes may be employed to form the first and second doped regions. The capacitor type dopants, for example, include n-type dopants. In one embodiment, an implant mask (not shown) may be employed to implant the dopants to form the doped regions within the device well 240. The implant mask, for example, is a patterned photoresist layer. The pattern implant mask selectively exposes regions of the substrate in which the doped regions are formed. The implant process may include suitable implant energy and implant dosage to form an intermediately doped region that extends partially into the base substrate as shown. For example, the intermediately doped region, which forms the first and second doped regions, may include a dopant concentration of about 5E12-5E13 $cm^{-2}$. Other dopant concentrations may also be useful. In one embodiment, the second doped region includes a depth from the top of the SOI substrate 201. The depth of the second doped region is, for example, about 1-5 μm from the top surface of the body substrate 205. The first doped region 216 may serve as a capacitor well of a control capacitor 150 and the second doped region 218 may serve as a doped back plane of the control capacitor 150.

Figure 5D:
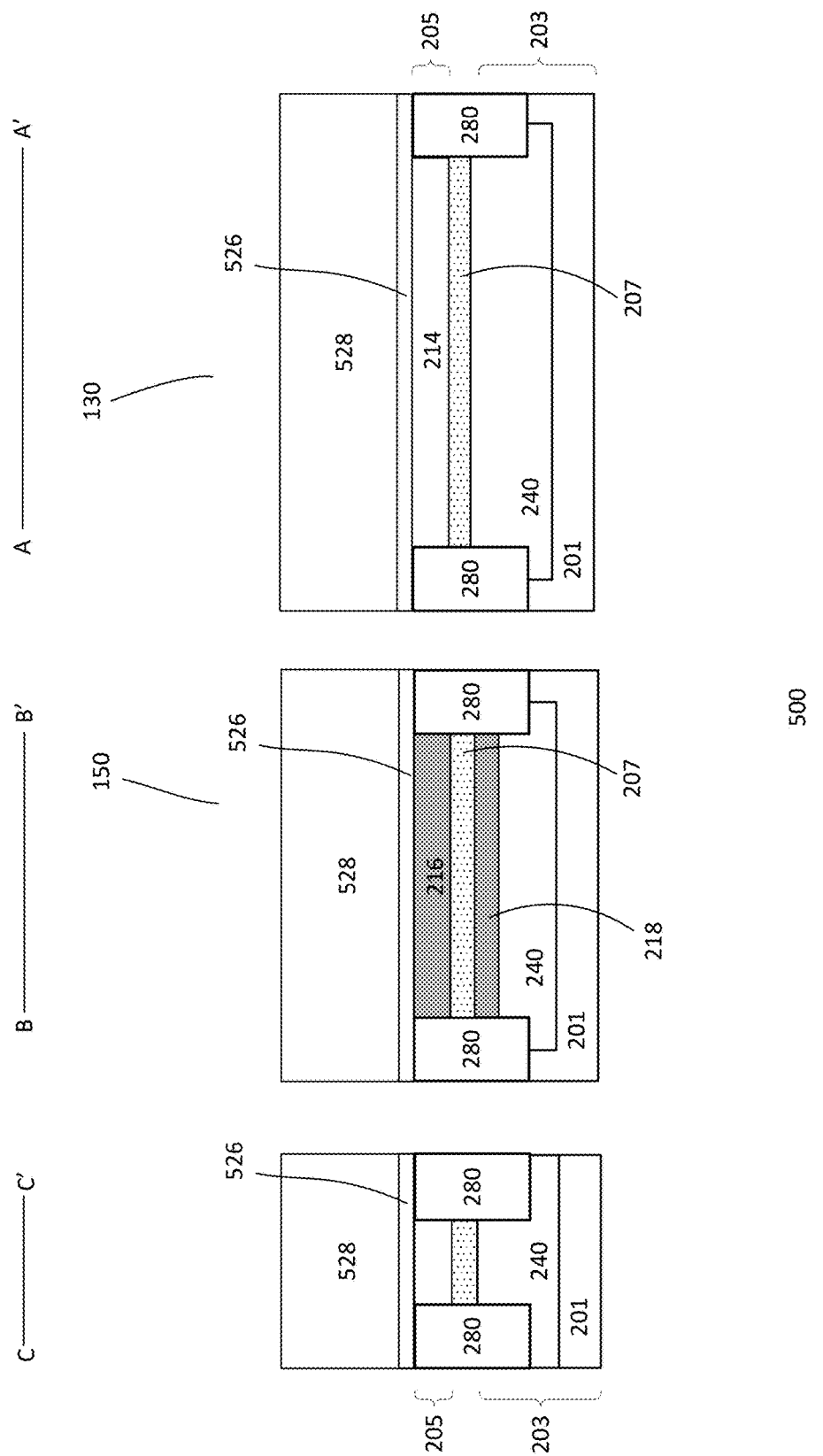

Referring to FIG. 5d, gate layers are formed on the body substrate 205. The gate layers, in one embodiment, include a gate dielectric layer 526 and a gate electrode layer 528 thereover. The gate dielectric layer, for example, may be a silicon oxide layer formed by, thermal oxidation. As for the gate electrode layer, it may be a polysilicon layer formed by chemical vapor deposition (CVD). Other suitable types of gate layers, including high k dielectric and metal gate electrode layers, or other suitable techniques for forming gate layers may also be useful.

Figure 5E:
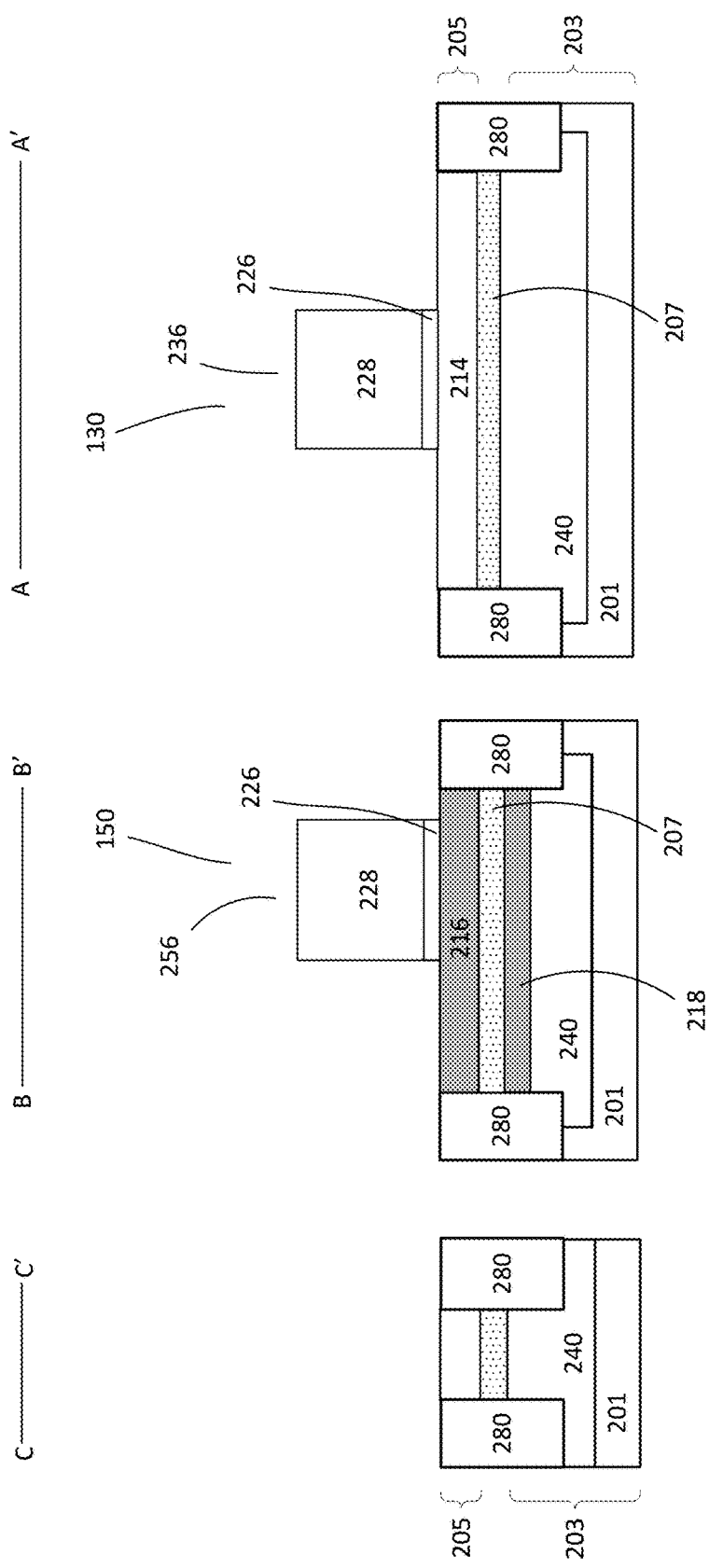

Referring to FIG. 5e, the gate layers are patterned to form the front gates of the device, such as transistor and capacitor gates. Patterning the gate layers may be achieved using mask and etch techniques. For example, a soft mask, such as photoresist may be formed over the gate electrode layer. An exposure source may selectively expose the photoresist layer through a reticle containing the desired pattern. After selectively exposing the photoresist layer, it is developed to form openings corresponding to location where the gate layers are to be removed. To improve lithographic resolution, an anti-reflective coating may be used below the photoresist layer. The patterned mask layer is used to pattern the gate layers. For example, an anisotropic etch, such as reactive ion etch (RIE), is used to remove exposed portions of the gate layers. Other types of etch processes may also be useful. The etch transfers the pattern of the mask layer to the underlying gate layers. Patterning the gate layers form transistor and capacitor gates 236 and 256 of the memory cell. For example, the transistor and capacitor gates are formed from common gate layers. A gate conductor, for example, may form the transistor and capacitor gates 236 and 256.

In one embodiment, the process may continue to form S/D extension regions (not shown). An implant mask (not shown) may be used to form the S/D extension regions. To form the extension regions, first polarity type dopants are implanted into the substrate. The first polarity type dopants, for example, include n-type dopants. In one embodiment, the implant forms LDD regions in the body substrate region adjacent to the transistor gate. For example, the LDD regions extend slightly under the gate. The LDD regions, for example, include a dopant concentration lower than transistor S/D regions.

In one embodiment, the process to form S/D extension regions may also include performing an implant to form halo regions (not shown). Halo regions may be formed by implanting second polarity type dopants into the body substrate. The second polarity type dopants, for example, include p-type dopants. The same implant mask to form the LDD regions may be used to form the halo regions. In one embodiment, the implant forms halo regions in the body substrate region adjacent to the transistor gate. For example, the halo regions extend beyond the LDD regions and slightly underlap the gate. The halo regions, for example, include a dopant concentration lower than the LDD regions. Other configurations of S/D extension regions may also be useful. Other techniques for forming the S/D extension regions may also be useful. In an alternative embodiment, the S/D extension regions may be formed after forming sidewall spacers. In this case, angled implants may be used to form the S/D extension regions below the sidewall spacers.

Figure 5F:
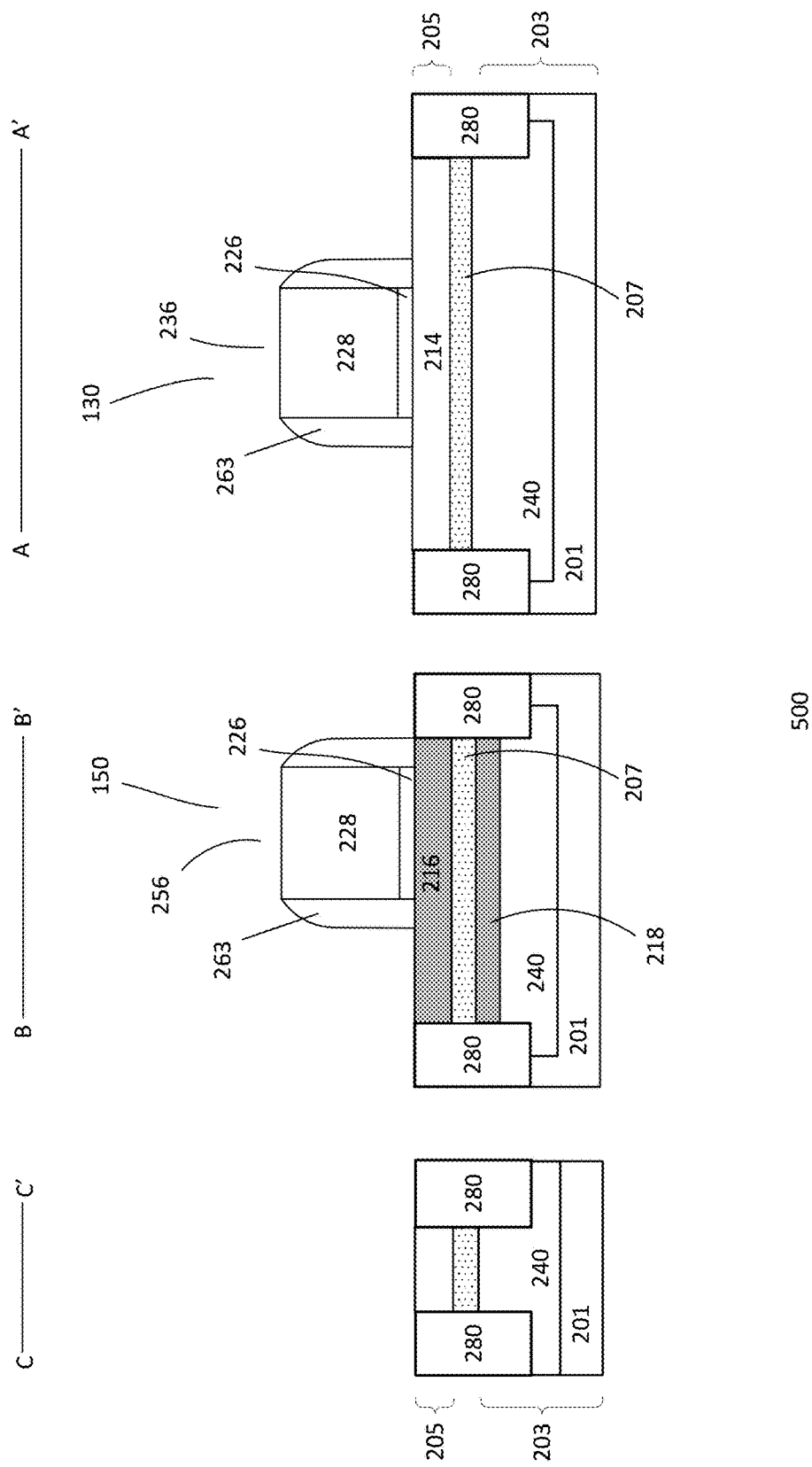

Referring to FIG. 5f, sidewall spacers 263 are formed on sidewalls of the gates 236 and 256. To form the spacers, a dielectric spacer layer, such as silicon oxide, is formed on the substrate covering the gates. The spacer layer may be formed by CVD. Other techniques for forming the spacer layer may also be useful. An anisotropic etch, such as RIE, is performed to remove horizontal portions of the spacer layer, leaving spacers 263 to abut the sidewalls of the gates as shown.

Figure 5G:
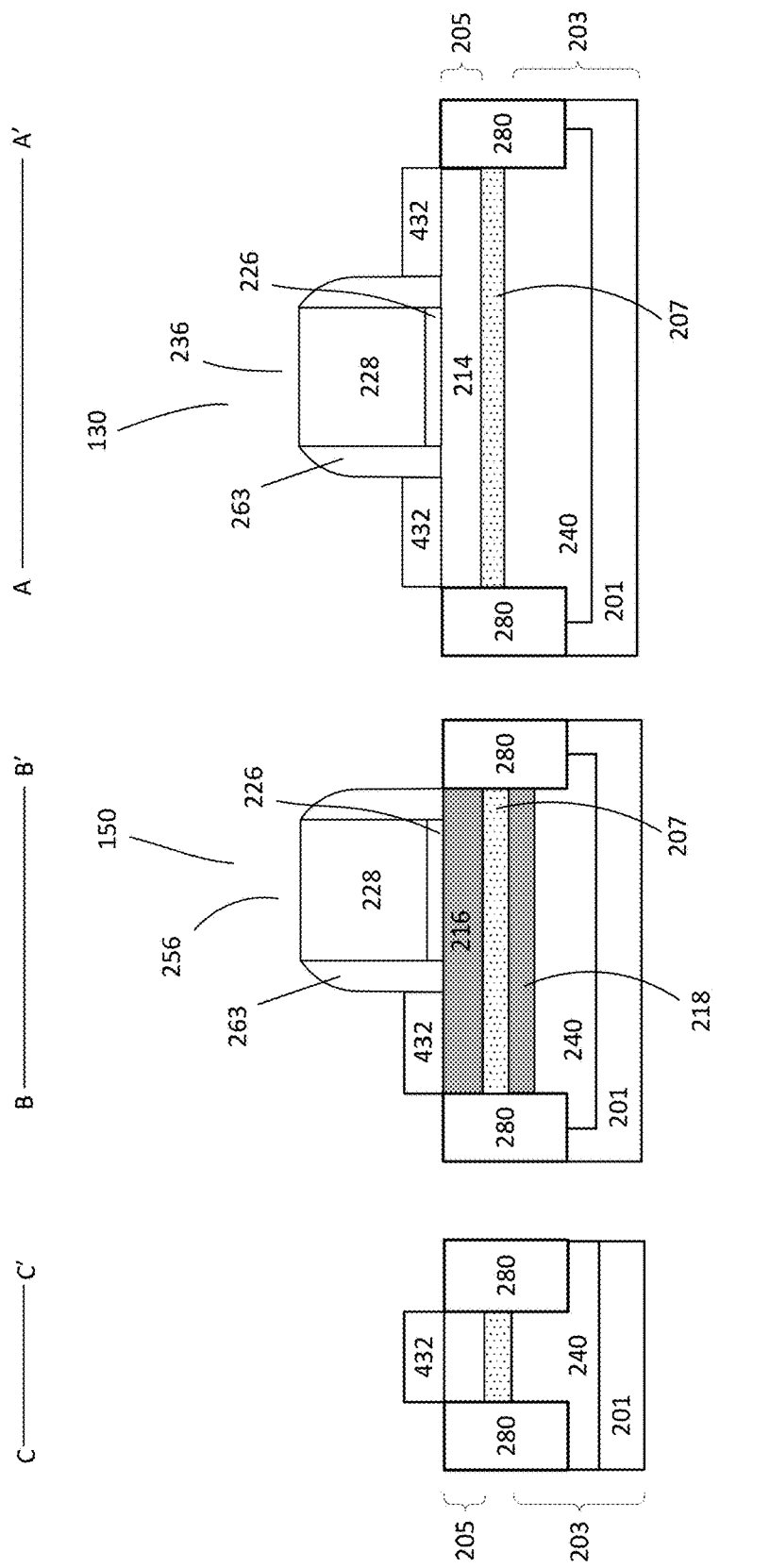

Referring to FIG. 5g, a discontinuous epitaxial layer 432 is formed on the body substrate. In one embodiment, selective epitaxial growth (SEG) is performed to form the discontinuous epitaxial layer 432 on exposed silicon portions of the body substrate. For example, the epitaxial layer is self-aligned to the isolation regions 280 and sidewall spacers 263 of the gates. The height of the epitaxial layers should be below the top surface of the gates.

Figure 5H:
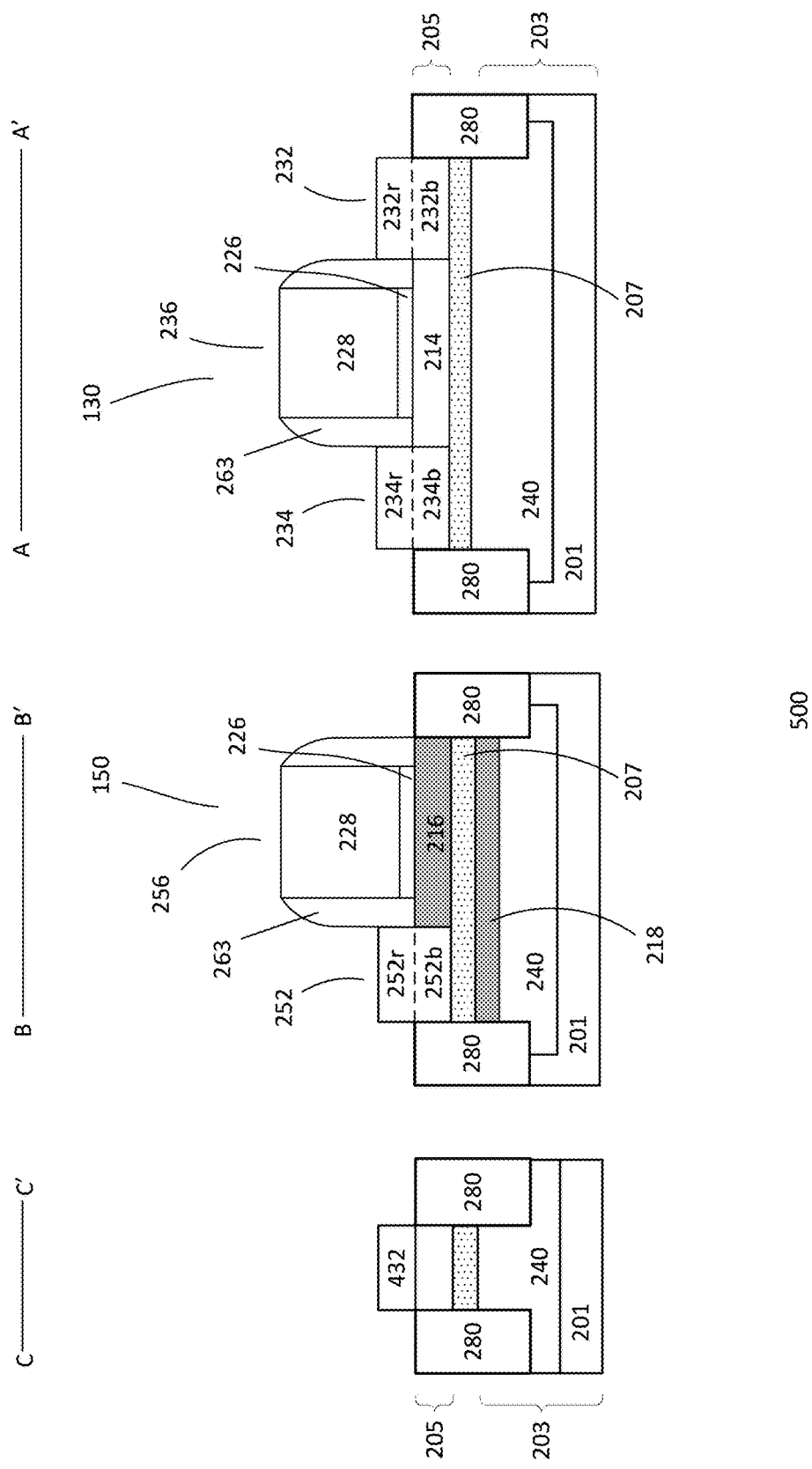

Referring to FIG. 5h, various contact regions of the memory cell are formed on exposed silicon portions of the substrate 201. In one embodiment, an implantation process is performed to form first and second S/D regions 232 and 234 and a control contact region 252. An implant mask (not shown) may be used to selectively form the various contact regions in the substrate. In one embodiment, the implant process simultaneously forms heavily doped first polarity type regions adjacent to the transistor gate and the capacitor gate. For example, the implant process introduces first polarity type dopants into the body substrate and the discontinuous epitaxial layer to form base and raised portions of the transistor S/D regions 232b, 232r and 234b, 234r, and base and raised portions of the control contact region 252b, 252r. The first polarity type dopants, for example, include n-type dopants. The implantation process to form the contact regions of the memory cell may also form first polarity type S/D regions in other device regions (not shown) on the same substrate. The S/D regions 232 and 234 and control contact region 252, for example, include dopant concentration of about 1E13-1E15 $cm^{-2}$. Other dopant concentrations may also be useful.

Figure 5I:
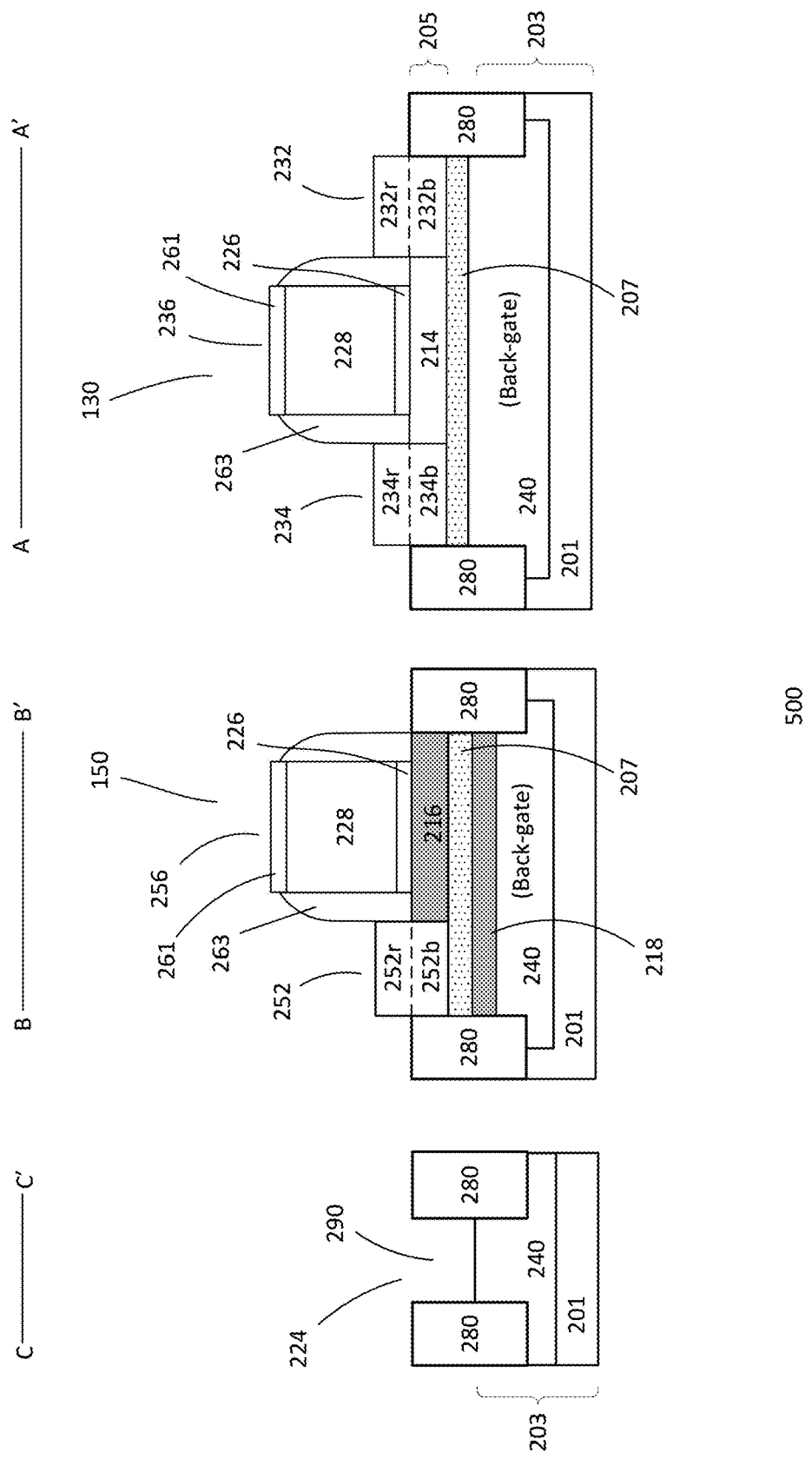

Referring to FIG. 5i, a portion of the body substrate 205 and BOX layer 203 is removed to form a trench region 290 above a portion of the base substrate. For example, the trench region extends to a sufficient depth to expose a back contact region 224 disposed within the base substrate so that a back contact can be formed for biasing the capacitor back-gate. Mask and etch techniques may be employed to form the trench region 290. For example, a patterned etch mask and a suitable etchant may be employed to selectively remove an exposed portion of the epitaxial layer 432, body substrate 205 and BOX layer 207 to form the trench 290 for a back contact as shown.

The process continues to complete forming the device. The process may include forming a silicide block 261 over the storage and control gates. The silicide block, for example, is a dielectric material, such as silicon oxide or silicon nitride. Other types of silicide block materials may also be useful. Providing a silicide block over the storage and control gates prevents formation of silicide contacts over these gates. Metal silicide contacts (not shown) may be provided on contact regions of the memory cell. For example, metal silicide contacts are provided on the raised S/D regions 232r and 234r, raised control contact region 252r, and the back contact region. The metal silicide contacts may be formed by any suitable techniques.

The processing may continue to form an interlayer dielectric (ILD) layer, conductive contact plugs coupled to the terminals of the memory cell, conductive contacts as well as one or more interconnect levels, final passivation, dicing, assembly and packaging. Other processes to complete forming the memory device may also be included.

The process 500 as described in FIGS. 5a-5i results in advantages. For example, the process 500 is compatible with at least the 28 nm and 22 nm FDSOI technology nodes. This provides a cost-free manufacturing platform with no additional process requirement. Moreover, although the process 500 illustrates forming an embodiment of a MTP memory cell, it is to be appreciated that the process may also be employed to form one-time programmable (OTP) memory cells.

The inventive concept of the present disclosure may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A non-volatile (NV) multi-time programmable (MTP) memory cell comprising:
    a silicon-on-insulator (SOI) substrate having a body substrate disposed over a base substrate, wherein a buried oxide (BOX) layer is disposed between the base substrate and the body substrate;
    an active region defined in the SOI substrate, wherein the active region comprises a transistor region and a capacitor region;
    a gate structure disposed on the SOI substrate, the gate structure comprises a gate electrode layer disposed over a gate dielectric layer, wherein the gate structure extends continuously across the active region to overlap the transistor region and the capacitor region, wherein a first portion of the gate structure defines a transistor gate and a second portion of the gate structure defines a capacitor gate;
    a first polarity type device well disposed in the base substrate, wherein the device well traverses the transistor region and the capacitor region, the device well underlaps the transistor gate and the capacitor gate;
    first and second doped regions disposed within the capacitor region, wherein the first doped region is disposed in the body substrate and the second doped region is disposed in the base substrate within the device well, wherein the first and the second doped regions comprise first polarity type dopants, wherein the first and the second doped regions comprise a higher dopant concentration of first polarity type dopants relative to the device well; and
    wherein a back contact region is defined in the base substrate within the device well, wherein the back contact region is displaced away from the transistor region and the capacitor region.

2. The memory cell of claim 1 wherein the SOI substrate is a fully depleted SOI substrate comprising a very thin body substrate and a very thin BOX layer.

3. The memory cell of claim 1 wherein the transistor region comprises first and second source/drain (S/D) regions disposed adjacent to first and second sides of the transistor gate, wherein the first and the second S/D regions comprise a heavily doped epitaxial layer disposed on the body substrate.

4. The memory cell of claim 3 wherein each of the first and the second S/D regions extend vertically from a top surface of the heavily doped epitaxial layer to a bottom surface of the body substrate.

5. The memory cell of claim 1 comprising a capacitor contact region disposed adjacent to a side of the capacitor gate within the capacitor region, wherein the capacitor contact region comprises a heavily doped epitaxial layer disposed on the body substrate.

6. The memory cell of claim 5 wherein the capacitor region is devoid of a second capacitor contact region.

7. The memory cell of claim 5 wherein the capacitor contact region and the back contact region in the base substrate are coupled to a common control gate line (CGL).

8. The memory cell of claim 5 wherein the device well include same polarity type dopants as the capacitor contact region and the back contact region.

9. The memory cell of claim 1 comprising a trench region disposed in the SOI substrate, wherein the trench region is disposed directly over the back contact region and extends through the body substrate and the BOX layer.

10. The memory cell of claim 1 comprising a silicide block disposed on the gate structure, wherein the silicide block covers a topmost surface of the transistor gate and the capacitor gate.

11. A non-volatile (NV) multi-time programmable (MTP) memory cell comprising:
    an ultra-thin silicon-on-insulator (SOI) substrate having a body substrate disposed over a base substrate, wherein a very thin buried oxide (BOX) layer is disposed between the base substrate and the body substrate;
    an active region defined in the SOI substrate, wherein the active region comprises a transistor region and a capacitor region;
    a gate structure disposed on the SOI substrate, the gate structure comprises a gate electrode layer disposed over a gate dielectric layer, wherein the gate structure extends continuously across the active region to overlap the transistor region and the capacitor region, wherein a first portion of the gate structure defines a transistor gate and a second portion of the gate structure defines a capacitor gate;
    a first polarity type device well disposed in the base substrate, wherein the device well traverses the transistor region and the capacitor region, the device well underlaps the transistor gate and the capacitor gate; and
    first and second doped regions disposed within the capacitor region, wherein the first doped region is disposed in the body substrate and the second doped region is disposed in the base substrate within the device well, wherein the first and the second doped regions comprise first polarity type dopants, wherein the first and the second doped regions comprise a higher dopant concentration of first polarity type dopants relative to the device well.

12. The memory cell of claim 11 wherein the first and second doped regions comprise a same or substantially similar concentration of first polarity type dopants.

13. The memory cell of claim 12 wherein the first and second doped regions are in contact with the BOX layer.

14. The memory cell of claim 11 comprising a back contact region defined in the base substrate within the device well, wherein the back contract region is displaced away from the transistor region and the capacitor region.

15. The memory cell of claim 11 wherein the transistor region comprises first and second source/drain (S/D) regions disposed adjacent to first and second sides of the transistor gate, wherein the first and the second S/D regions comprise heavily doped epitaxial layers disposed on the body substrate.

16. The memory cell of claim 11 comprising a silicide block disposed on the gate structure, wherein the silicide block extends over the transistor gate and the capacitor gate.

17. A non-volatile (NV) multi-time programmable (MTP) memory cell comprising:
   a fully depleted silicon-on-insulator (FDSOI) substrate having a body substrate disposed over a base substrate, wherein the FDSOI substrate includes a thin buried oxide (BOX) layer disposed between the base substrate and the body substrate;
   an active region defined in the FDSOI substrate, wherein the active region comprises a transistor region and a capacitor region;
   a gate structure disposed on the FDSOI substrate, the gate structure comprises a gate electrode layer disposed over a gate dielectric layer, wherein the gate structure extends continuously across the active region to overlap the transistor region and the capacitor region, wherein a first portion of the gate structure defines a transistor gate and a second portion of the gate structure defines a capacitor gate, wherein the transistor gate and the capacitor gate comprise a common gate electrode layer and a common gate dielectric layer;
   a first polarity type device well disposed in the base substrate, wherein the device well extends laterally to traverse the transistor region and the capacitor region, the device well underlaps the transistor gate and the capacitor gate;
   first and second doped regions disposed within the capacitor region, wherein the first doped region is disposed in the body substrate and the second doped region is disposed in the base substrate within the device well, wherein
      the first and the second doped regions are first polarity type doped regions comprising a higher dopant concentration of first polarity type dopants relative to the device well, and
      the second doped region extends to a depth shallower than a depth of the device well; and
   wherein a contact region is defined in the base substrate within the device well, wherein the contact region is displaced away from the transistor region and the capacitor region.

18. The memory cell of claim 17 wherein the first and second doped regions are intermediately doped with first polarity type dopants, the device well is lightly doped with first polarity type dopants, and the first polarity type dopant is n-type dopant.

19. The memory cell of claim 17 wherein the transistor region comprises first and second source/drain (S/D) regions disposed adjacent to first and second sides of the transistor gate, and wherein the first and second S/D regions comprise a heavily doped epitaxial layer disposed on the body substrate.

20. The memory cell of claim 17 comprising a trench region disposed in the FDSOI substrate over the contact region, wherein the trench region extends downwardly through the body substrate and the BOX layer to expose the contact region.

* * * * *